(12) United States Patent  
Xie et al.

(10) Patent No.: US 9,093,467 B1  
(45) Date of Patent: Jul. 28, 2015

(54) METHODS OF FORMING GATE STRUCTURES FOR SEMICONDUCTOR DEVICES USING A REPLACEMENT GATE TECHNIQUE AND THE RESULTING DEVICES

(71) Applicant: GLOBALFOUNDRIES Inc., Grand Cayman (KY)

(72) Inventors: Ruilong Xie, Niskayuna, NY (US); Kisik Choi, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/172,058

(22) Filed: Feb. 4, 2014

(51) Int. Cl.  
*H01L 21/338* (2006.01)  
*H01L 29/66* (2006.01)

(52) U.S. Cl.  
CPC .................................. *H01L 29/6659* (2013.01)

(58) Field of Classification Search  
CPC ............ H01L 29/6659; H01L 29/6656; H01L 29/7833; H01L 29/6653; H01L 21/823807  
USPC .................................................. 438/183, 184  
See application file for complete search history.

(56) References Cited

U.S. PATENT DOCUMENTS

| 8,436,404 | B2 | 5/2013 | Bohr et al. |
| 8,592,265 | B2 * | 11/2013 | Kim et al. ..................... 438/184 |
| 8,928,048 | B2 | 1/2015 | Xie et al. |
| 2011/0108930 | A1 | 5/2011 | Cheng et al. |
| 2011/0298061 | A1 | 12/2011 | Siddiqui et al. |
| 2012/0139061 | A1 | 6/2012 | Ramachandran et al. |
| 2012/0175711 | A1 | 7/2012 | Ramachandran et al. |
| 2013/0248950 | A1 | 9/2013 | Kang et al. |

OTHER PUBLICATIONS

U.S. Appl. No. 13/947,670, filed Jul. 22, 2013.  
U.S. Appl. No. 13/959,847, filed Aug. 6, 2013.  
Notice of Allowance from related application U.S. Appl. No. 13/947,670 dated Apr. 17, 2015.

* cited by examiner

*Primary Examiner* — Quoc Hoang  
(74) *Attorney, Agent, or Firm* — Amerson Law Firm, PLLC

(57) ABSTRACT

One method and device disclosed includes, among other things, forming a recessed sacrificial gate electrode having a recessed upper surface, performing at least one second etching process to define recessed sidewall spacers positioned adjacent the recessed sacrificial gate electrode, forming a plurality of sidewall spacers within a gate opening above the recessed sidewall spacers, wherein one of the spacers comprises a low-k insulating material that is positioned laterally between two other spacers and a gate cap layer, removing the recessed sacrificial gate electrode and forming a replacement gate structure in its place.

8 Claims, 13 Drawing Sheets

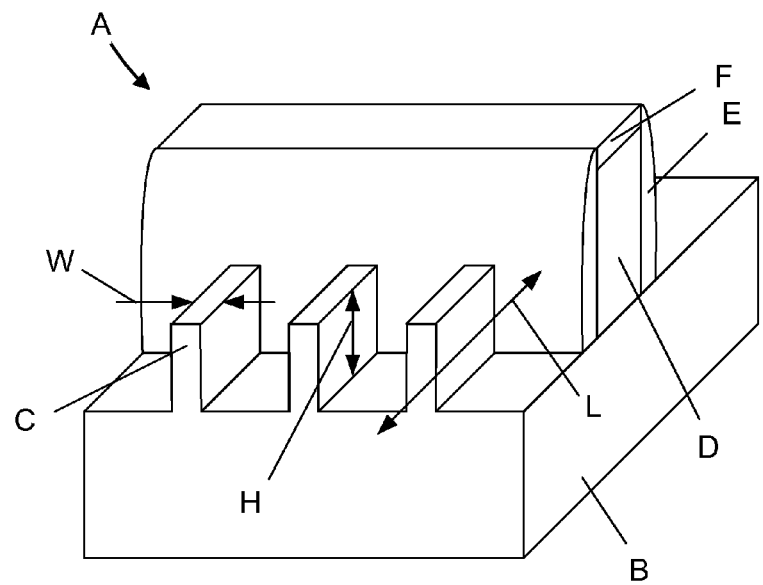
Figure 1A (Prior Art)
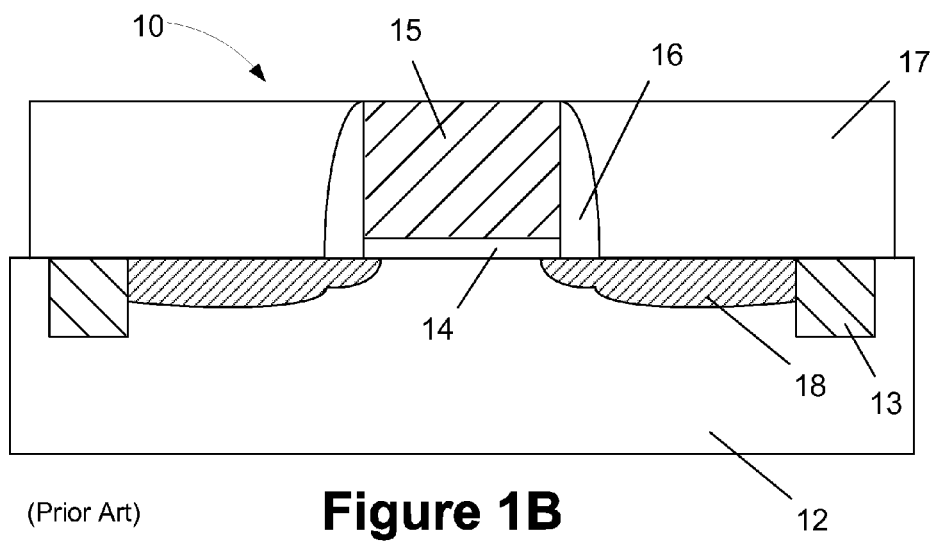
(Prior Art) Figure 1B

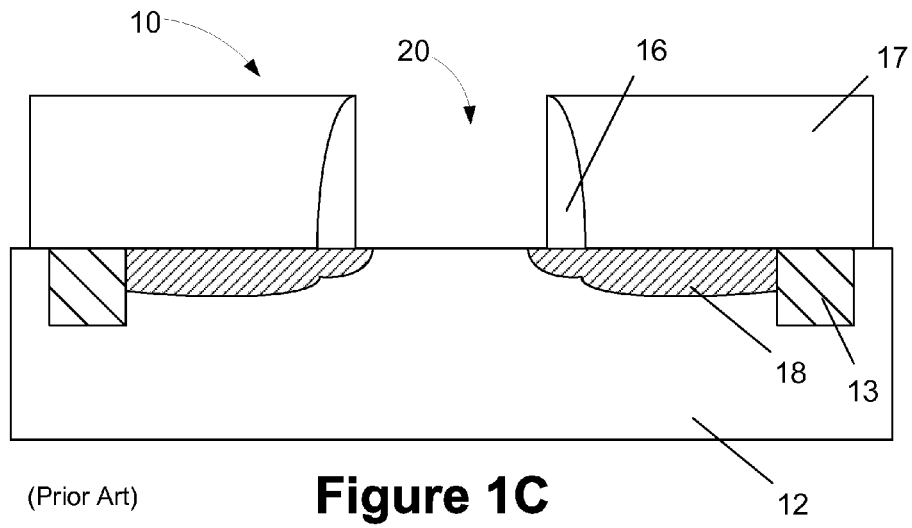
(Prior Art) Figure 1C
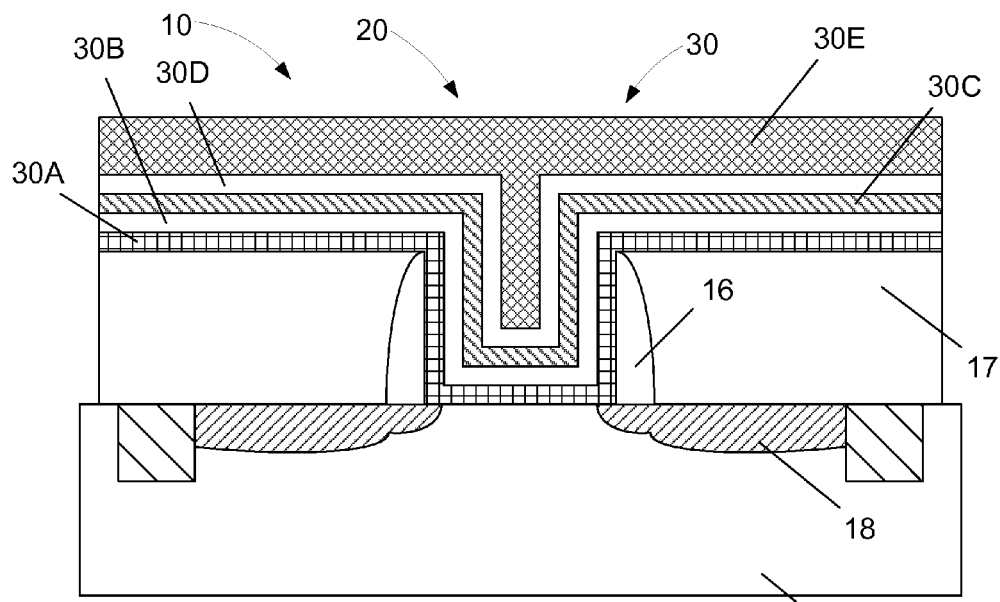
(Prior Art) Figure 1D

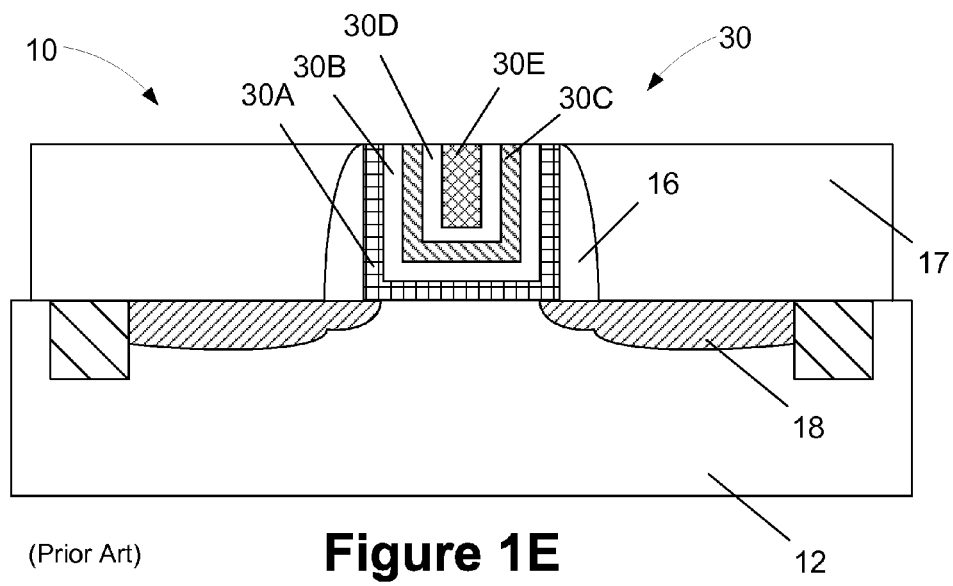
(Prior Art) Figure 1E
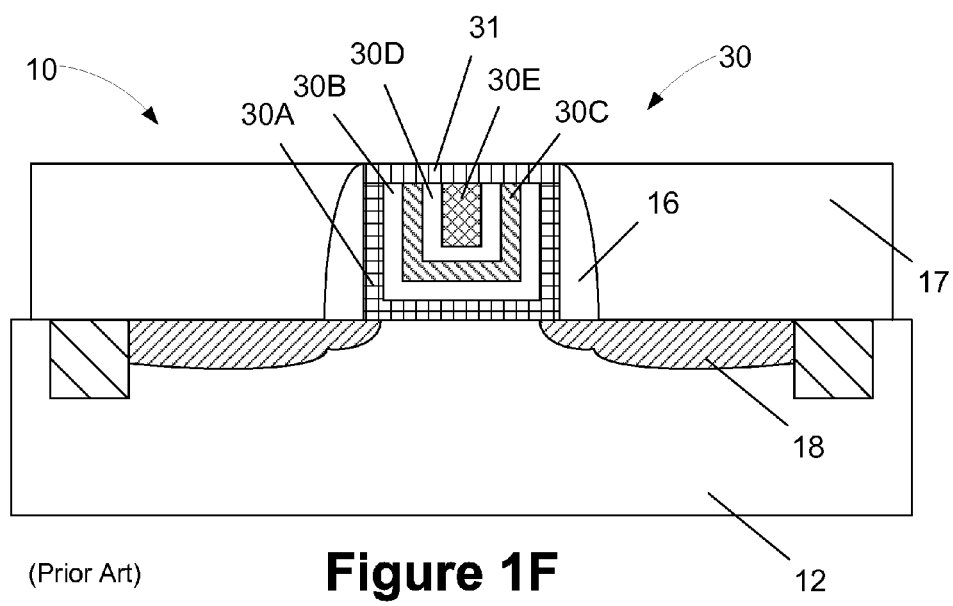
(Prior Art) Figure 1F

METHODS OF FORMING GATE STRUCTURES FOR SEMICONDUCTOR DEVICES USING A REPLACEMENT GATE TECHNIQUE AND THE RESULTING DEVICES

BACKGROUND OF THE INVENTION

1. Field of the Invention

The present disclosure generally relates to the fabrication of integrated circuits, and, more particularly, to various methods of forming gate structures for semiconductor devices, such as transistors, using a replacement gate technique and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device, the gate structure D may enclose both the sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1E simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a replacement gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

As the gate length of transistor devices has decreased, the physical size of the gate cavity 20 has also decreased. Thus, it is becoming physically difficult to fit all of the layers of material needed for the replacement gate structure 30 within such reduced-size gate cavities, particularly for NMOS devices, due to the greater number of layers of material that are typically used to form the gate structures for the NMOS devices. For example, as gate lengths continue to decrease, voids or seams may be formed as the various layers of material are deposited into the gate cavity 20. FIG. 1G is a somewhat enlarged view of an illustrative NMOS device that is provided in an attempt to provide the reader with some idea of just how limited the lateral space 20S is within the gate cavity 20 of an NMOS device as the various metal layers 30A-30D are formed in the gate cavity 20. In FIG. 1G, the internal sidewall surfaces of the spacers 16 define a gate cavity 20 having a substantially uniform width 20S throughout the height or depth of the gate cavity 20. As the layers of material in the gate stack for the device are formed in the cavity 20, the remaining space 39 within the gate cavity 20 becomes very small. As the latter metal layers are formed, the lateral space 39 may be about 1-2 nm in width or even smaller. In some cases, the space 39 may be essentially non-existent. This may lead to so-called "pinch-off" of metal layers such that voids or seams may be formed in the overall gate stack, which may result in devices that perform at levels less than anticipated or, in some cases, the formation of devices that are simply not acceptable and have to be discarded.

When manufacturing advanced integrated circuit products using replacement gate structures, particularly in situations where the products also include very tight spacing between source/drain contact structures, such as products using self-aligned source/drain contacts, some amount of the work function metals in the gate cavity 20 must be removed from the gate cavity 20 to make room for additional materials, i.e., to make room within the upper portion of the gate cavity 20 for a bulk conductor material, such as tungsten and aluminum, and a gate cap layer. This process operation is sometimes referred to as work-function chamfering. In such a work-function chamfering process, some form of a protective material must be formed in the gate cavity 20 above the metal layer 30D to protect desired portions of the underlying metal layers during the recess etching process. If the lateral space 39 (to the extent it exists) cannot be reliably filled with such a protective material, such as a flowable oxide material, then the recessing etching process cannot be performed for fear of removing undesired portions of the metal layers during the course of performing the recess etching process.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

As device dimensions have decreased, the conductive contact elements in the contact level, e.g., source/drain contacts, have to be provided with critical dimensions in the same order of magnitude. For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures. Additionally, due to the continued reduction in gate pitch, and the nature of how a self-aligned contact is formed, the contact structure is positioned very close to the gate electrode. This arrangement forms a parasitic capacitor, namely a gate-to-contact capacitor, and the role of this capacitor in determining circuit performance is becoming more important as device and pitch scaling continues. However, further reduction in spacer thickness (width) must be done with extreme caution to avoid an undesirable rapid increase in the contact-to-gate capacitance with degrades the RC delay of the transistors.

The present disclosure is directed to various methods of forming gate structures for semiconductor devices, such as transistors, using a replacement gate technique and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate structures for semiconductor devices, such as transistors, using a replacement gate technique and the resulting semiconductor devices. One method disclosed herein includes, among other things, performing at least one first etching process to remove a portion, but not all, of a sacrificial gate electrode so as to thereby define a recessed sacrificial gate electrode having a recessed upper surface, performing at least one second etching process to define recessed sidewall spacers positioned adjacent the recessed sacrificial gate electrode, wherein the recessed sidewall spacers, recessed sacrificial gate electrode and a layer of insulating material define a gate opening, forming a plurality of sidewall spacers within the gate opening, wherein one of the spacers is comprised of low-k insulating material (an insulating material having a dielectric constant equal to or less than 3.9) that is positioned laterally between two other spacers, after forming the plurality of sidewall spacers, removing at least the recessed sacrificial gate electrode so as to define, at least in part, a replacement gate cavity, forming a replacement gate structure within the replacement gate cavity and forming a gate cap layer within the replacement gate cavity above the replacement gate structure.

One illustrative device disclosed herein includes, among other things, a gate structure positioned above an upper surface of a semiconductor substrate, wherein the gate structure comprises a high-k gate insulation layer and a gate electrode comprised of at least one layer of metal, a sidewall spacer positioned adjacent opposite sides of at least a portion of the gate electrode, wherein the sidewall spacers have an upper surface that is positioned above the upper surface of the substrate, a gate cap layer positioned above at least the gate electrode, a layer of insulating material positioned above the surface of the substrate and around the gate structure, a plurality of sidewall spacers positioned laterally between the layer of insulating material and a portion of the gate structure and vertically between the upper surface of the sidewall spacers and a bottom surface of the gate cap layer, wherein the plurality of spacers comprise a low-k spacer comprised of an insulating material having a dielectric constant equal to or less than 3.9.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1G depict one illustrative prior art method of forming a gate structure of a transistor using a so-called "replacement gate" technique.

Figure 1G:
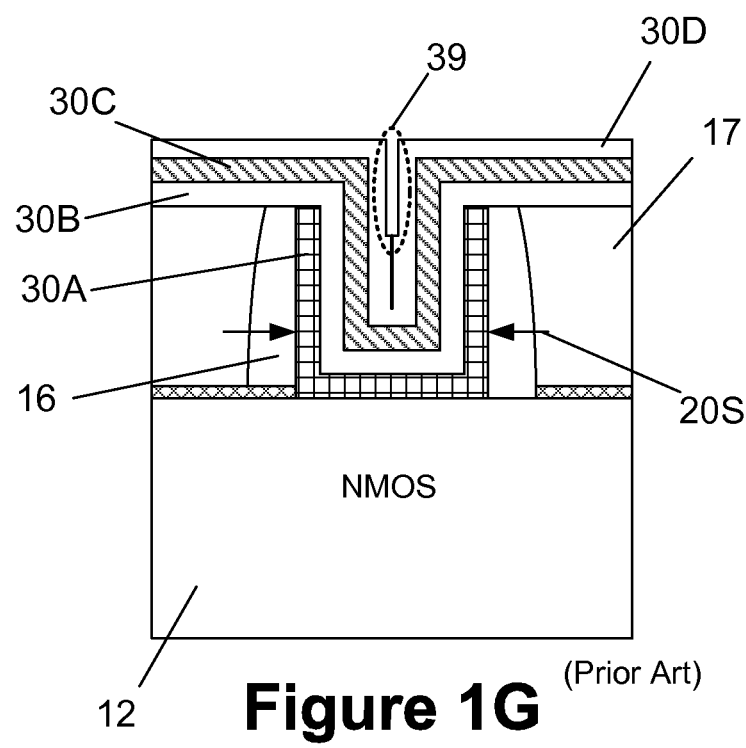

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming gate structures for semiconductor devices using a replacement gate technique. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the inventions disclosed herein should not be considered to be limited to the illustrative examples depicted and described herein. With reference to the attached figures, various illustrative embodiments of the methods and devices disclosed herein will now be described in more detail.

One conceptual technique that may be employed to avoid the problems associated with work-function chamfering, as noted in the background section of this application, would be to increase the width of the upper portion of the gate cavity by reducing the thickness of the spacers. One technique that involves, among other things, reducing the thickness of the spacers is disclosed in a pending U.S. application entitled "Methods of Forming Replacement Gate Structures for Transistors and the Resulting Devices," Ser. No. 13/959,847, wherein two of the four inventors on that application are the two named inventors in the present application. Another technique that involves, among other things, removing an entire upper portion of the spacers is disclosed in a pending U.S. application entitled "Methods of Forming Semiconductor Device With Self-Aligned Contact Elements and the Resulting Devices," Ser. No. 13/947,670, wherein one of the four inventors on that application is one of the two named inventors in the present application. However, the conductive source/drain contact structures for a device, the gate electrode and the insulating material positioned therebetween, e.g., the insulating sidewall spacer, define a Gate-to-Contact capacitor. Given the critical nature of the electrical performance of modern devices, all other things being equal, it is desirable that the parasitic Gate-to-Contact capacitance be as low as possible. Unfortunately, by reducing the thickness of the sidewall spacers in an attempt to avoid the problems associated with work-function chamfering, the space between the gate electrode and the conductive source/drain contact structures will be decreased, thereby tending to undesirably increase the parasitic Gate-to-Contact capacitance. The presently disclosed inventions may be useful in resolving or reducing the effects of some of these problems.

As will be appreciated by those skilled in the art after a complete reading of the present application, the methods and structures disclosed herein may be used when forming either planar or 3D transistor devices. An illustrative device 100 in the form of a planar device will be depicted for purposes of disclosing the subject matter set forth herein. Additionally, various doped regions, e.g., source/drain regions, halo implant regions, well regions and the like, are not depicted in the attached drawings. Of course, the inventions disclosed herein should not be considered to be limited to the illustrative examples depicted and described herein. Moreover, the transistor devices that are depicted in the attached drawings may be either NMOS or PMOS devices. The illustrative transistor device 100 depicted in the drawings is formed above an illustrative substrate 102 that may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. Thus, the terms "substrate" or "semiconductor substrate" should be understood to cover all semiconducting materials and all forms of such materials.

Figure 2A:
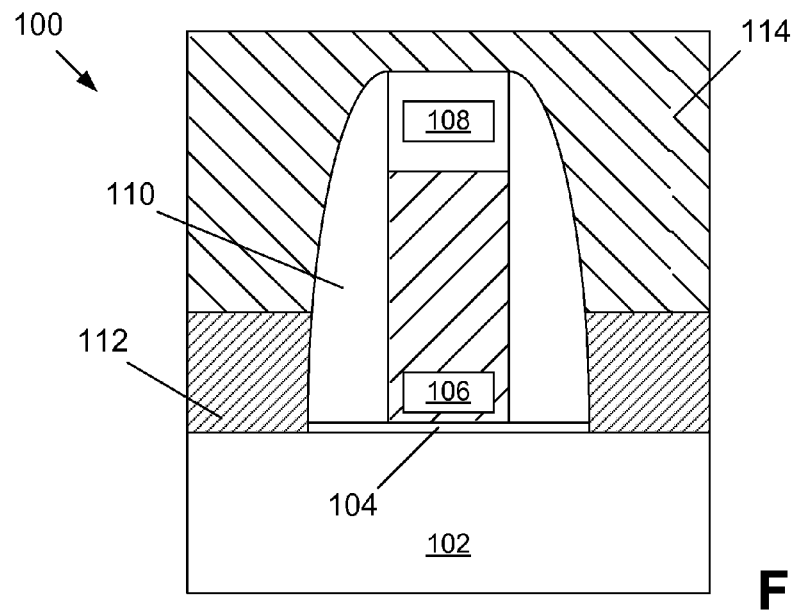
FIGS. 2A-2T depict various illustrative methods disclosed herein for various methods of forming gate structures for semiconductor devices using a replacement gate technique and the resulting semiconductor devices.

In the examples disclosed herein, the device 100 will be formed using a replacement gate technique. Accordingly, FIG. 2A depicts the device 100 at a point in fabrication wherein several layers of material and structures have been formed above the substrate 102. More specifically, at the point of fabrication depicted in FIG. 2A, the device 100 includes a sacrificial gate insulation layer 104, a dummy or sacrificial gate electrode 106, sidewall spacers 110, a layer of insulating material 114 and an illustrative gate cap layer 108 that has been formed above the sacrificial gate electrode layer 106. The device depicted in FIG. 2A may be comprised of a variety of different materials. For example, the sacrificial gate insulation layer 104 may be comprised of silicon dioxide, the sacrificial gate electrode 106 may be comprised of polysilicon or amorphous, the sidewall spacers 110 and the gate cap layer 108 may be comprised of silicon nitride and the layer of insulating material 114 may be comprised of silicon dioxide. The sidewall spacers 110 may be comprised of silicon nitride and they may formed by depositing a layer of spacer material and thereafter performing an anisotropic etching process to produce the spacers 110. The base width of the spacers 110 may vary depending upon the particular application, e.g., 6-15 nm. Also depicted in FIG. 2A are regions of illustrative epi semiconductor material 112 that were formed in/or above the source/drain regions of the device 100. Of course, such epi semiconductor material 112 need not be formed to practice the various inventions disclosed herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2B:
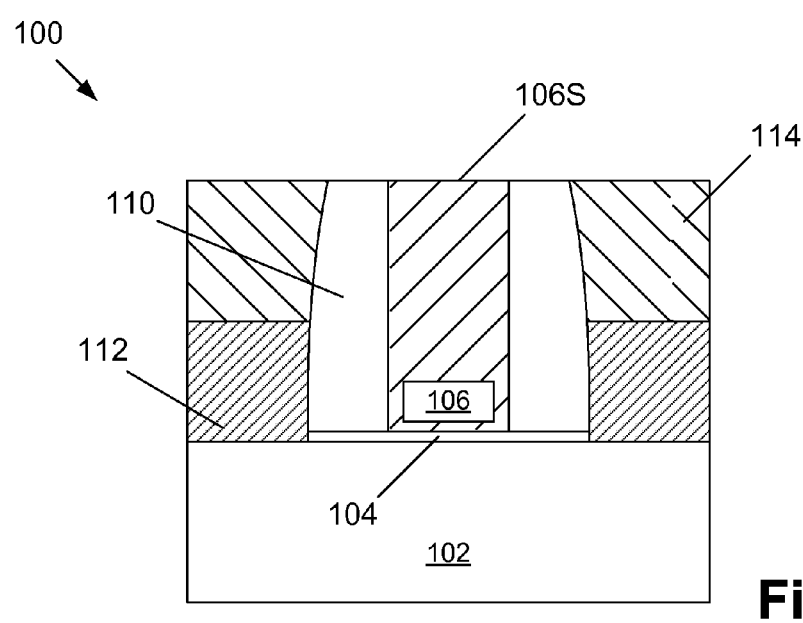

FIG. 2B depicts the device 100 after one or more chemical mechanical polishing (CMP) processes were performed to remove any materials above the sacrificial gate electrode 106 (such as the protective cap layer 108) such that the upper surface 106S of the sacrificial gate electrode 106 is exposed so that the sacrificial gate electrode 106 can be removed.

Figure 2C:
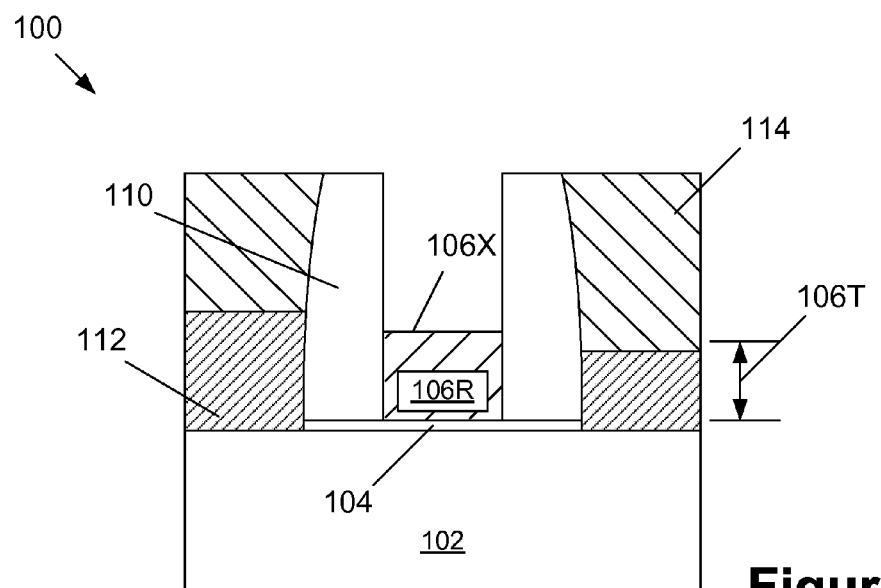

FIG. 2C depicts the device 100 after a timed, recess etching process was performed to remove a portion, but not all, of the sacrificial gate electrode 106. This etching process results in the formation of a recessed sacrificial gate electrode 106R having a thickness 106T and a recessed surface 106X. The thickness 106T of the recessed sacrificial gate electrode 106R is targeted to be the desired final thickness of the work-function metal(s) to be formed for the device 100. The thickness 106T may vary depending upon the particular application. In one illustrative embodiment, the thickness 106T may fall within the range of about 10-30 nm.

Figure 2D:
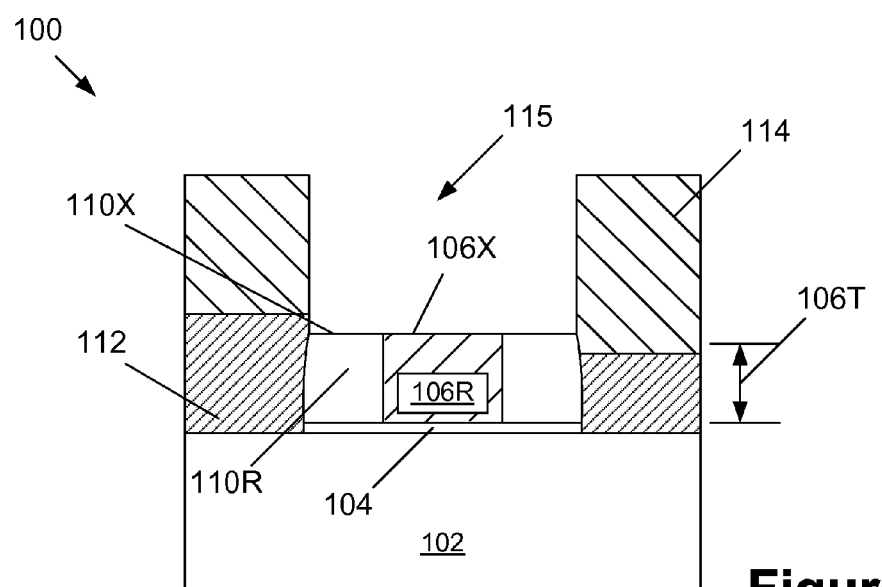

FIG. 2D depicts the device 100 after a timed etching process was performed to remove portions of the sidewall spacers 110 selectively relative to the surrounding materials. This etching process results in the formation of a recessed sidewall spacers 110R having an upper recessed surface 110X and a gate opening 115. In general, the spacers 110 may be formed of a high-k material that, for purposes of this application and the claims as it relates to the spacer materials, is a material having a dielectric constant of 5.5 or greater, e.g., silicon nitride, SiCN, SiBCN, SiBCON, etc.

The next sequence of process operations involves formation of a plurality of spacer or liner structures 120, 122 and 124 in the gate opening 115 above the upper surface 110X of the recessed spacers 110R. The spacers may be formed by depositing a layer of spacer material above the device and in the cavity and thereafter performing an anisotropic etching process to produce the depicted spacers. In general, the spacers 120 and 124 may be formed of a high-k material (k value of 5.5 or greater) while the spacer 122 may be formed of a material that has a dielectric constant of 3.9 or less (a "low-k material" for purposes of this application and the claims).

Figure 2E:
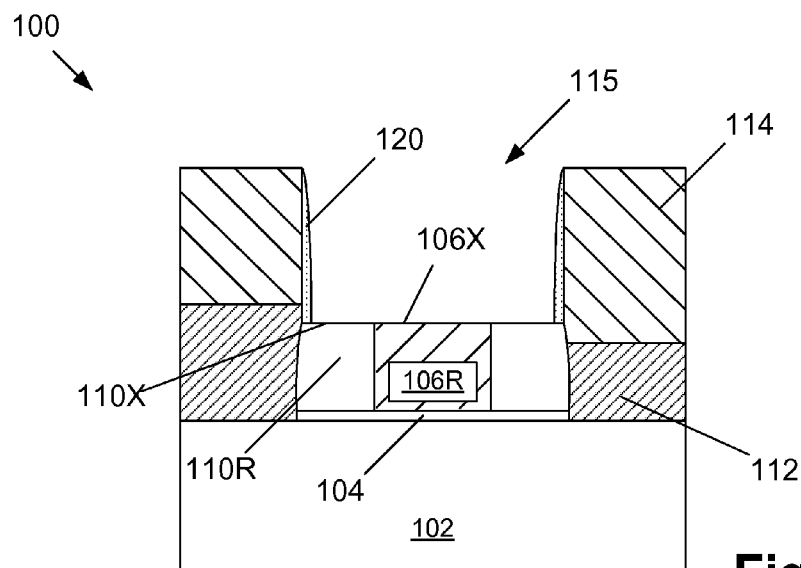

FIG. 2E depicts the device 100 after a first sidewall spacer 120 has been formed on the exposed portions of the layer of insulating material 114 above the upper surface 110X of the recessed spacers 110R. The first sidewall spacer 120 should be formed of a material that may be selectively etched relative to at least the layer of insulating material 114. In one illustrative example where the layer of insulating material is made of silicon dioxide, the first sidewall spacer 120 may be made of silicon nitride, SiCN, SiBCN or SiBCON, etc. The base thickness of the first sidewall spacer 120 may vary depending upon the particular application. In one illustrative embodiment, the base thickness of the first sidewall spacer 120 may fall within the range of about 1-3 nm.

Figure 2F:
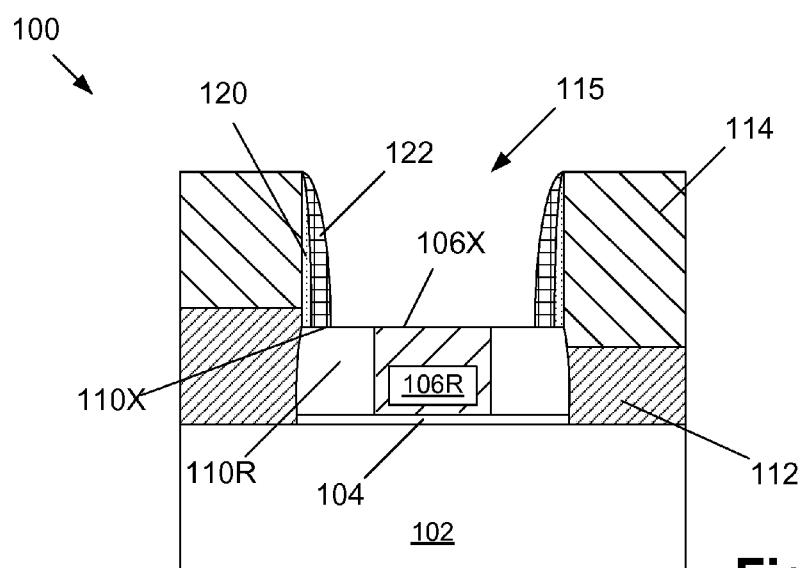

FIG. 2F depicts the device 100 after a second sidewall spacer 122 has been formed on the first sidewall spacer 120 and above the upper surface 110X of the recessed spacers 110R within the gate opening 115. As noted above, the second sidewall spacer 122 is comprised of low-k material. In one illustrative example, the second sidewall spacer 122 may be made of silicon dioxide. The base thickness of the second sidewall spacer 122 may vary depending upon the particular application. In one illustrative embodiment, the base thickness of the second sidewall spacer 122 may fall within the range of about 3-8 nm.

Figure 2G:
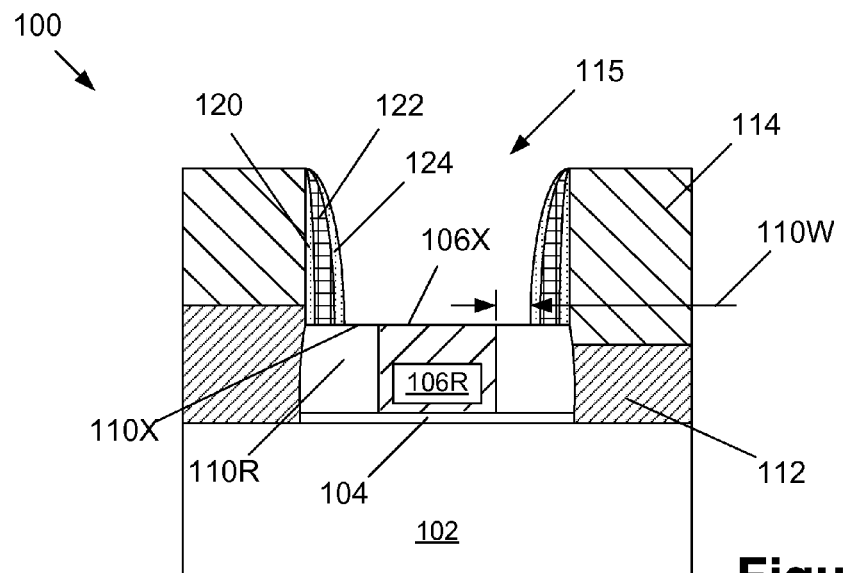

FIG. 2G depicts the device 100 after a third sidewall spacer 124 has been formed on the second sidewall spacer 122 above the upper surface 110X of the recessed spacers 110R. The third sidewall spacer 124 should be formed of a material that may be selectively etched relative to at least the second sidewall spacer 122. In one illustrative example where the second sidewall spacer 122 is made of silicon dioxide, the third sidewall spacer 124 may be made of a high-k material (k value of 5.5 or greater), such as silicon nitride, SiCN, SiBCN, or SiBCON, etc. The spacers 120 and 124 need not be made of the same material, but that can be the case in some applications. The base thickness of the third sidewall spacer 124 may vary depending upon the particular application. In one illustrative embodiment, the base thickness of the third sidewall spacer 124 may fall within the range of about 1-3 nm.

As will be appreciated by those skilled in the art after a complete reading of the present application, the first sidewall spacer 120 and the third sidewall spacer 124 are formed in an effort to protect or encapsulate the low-k second sidewall spacer 122 during subsequent processing operations. In one embodiment, the collective width of the three spacers 120, 122 and 124 should be such that, after the formation of the three spacers, a portion of the upper surface 110X of the recessed spacers 110R remains exposed. In one embodiment, the remaining exposed portion of the upper surface 110X has a width 110W of about 1.5-4 nm, a width which may vary depending upon the particular application.

Figure 2H:
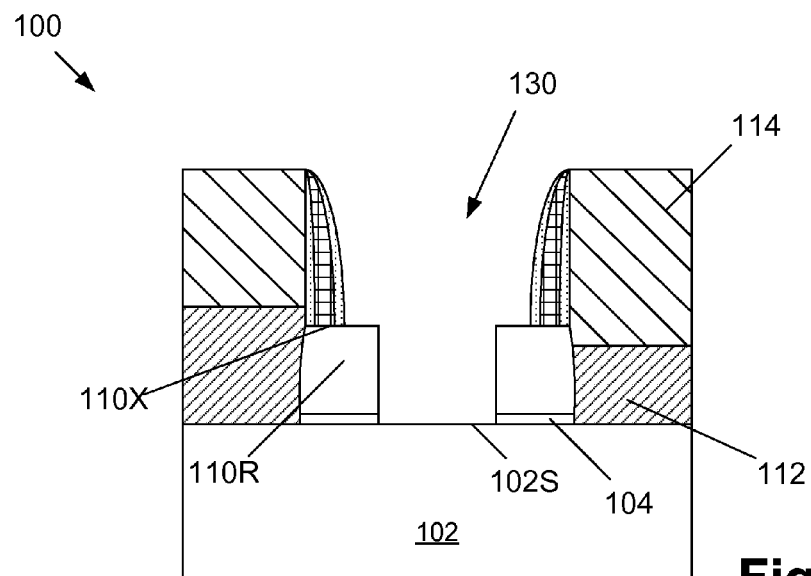

FIG. 2H depicts the device 100 after one or more wet or dry etching processes were performed to remove the recessed sacrificial gate electrode 106R and the exposed portions of the sacrificial gate insulation layer 104 to thereby define a replacement gate cavity 130 where a replacement gate structure (the final gate structure) will subsequently be formed for the device 100. Typically, the sacrificial gate insulation layer 104 is removed as part of the replacement gate technique, as depicted herein. Even in cases where the sacrificial gate insulation layer 104 is intentionally removed, there will typically be a very thin native oxide layer (not shown) that forms on the surface 102S of the substrate 102 within the replacement gate cavity 130.

Figure 2I:
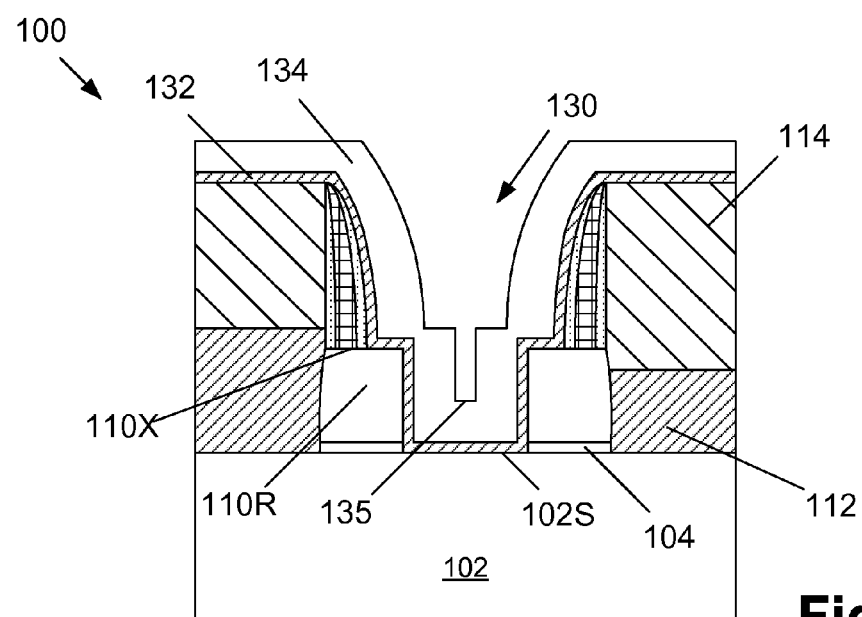

The next major process sequence involves formation of the replacement gate structure for the device 100. The replacement gate structure that will be depicted herein is intended to be representative in nature of any type of gate structure that may be employed in manufacturing integrated circuit products using so-called gate-last (replacement-gate) manufacturing techniques. Accordingly, with reference to FIG. 2I, a pre-clean process was performed in an attempt to remove all foreign materials from within the gate cavity 130 prior to forming the various layers of material that will become part of the replacement gate structure. Next, a high-k (k value greater than 10) gate insulation layer 132, such as hafnium oxide (or the other high-k materials noted in the background section of this application), was deposited across the device 100 and within the replacement gate cavity 130 above the substrate 102 by performing a conformal deposition process. If desired, a thin interfacial layer of silicon dioxide (not shown) may be formed prior to the formation the high-k gate insulation layer 132. Next, at least one work function adjusting metal layer 134 (e.g., a layer of titanium nitride or TiAlC depending upon the type of transistor device being manufactured) was deposited on the high-k gate insulation layer 132 and within the replacement gate cavity 130 by performing a conformal deposition process. Of course, the work function adjusting metal layer 134 may be comprised of any of the metals described in the background section of this application and more than one layer of work function metal may be formed in the replacement gate cavity 130, depending upon the particular device under construction. Due to the very small sizes of the replacement gate cavities 130 in modern transistor devices, the formation of the work function adjusting metal layer 134 may result in the formation of a very narrow opening or recess 135 within the replacement gate cavity 130. As noted in the background section of this application, as channel lengths have continued to decrease, the lateral size of such recesses 135 has become so small that it has become difficult to reliably fill openings of this size, even when using specifically designed materials to fill such small openings, such as OPL material. As a result, the recessing of the work function materials becomes more difficult and less reliable. However, in accordance with one aspect disclosed herein, as described more fully below, by using the process flows disclosed herein, the work function metal recessing process may be performed without having to fill the small size openings 135, to the extent they exist.

Figure 2J:
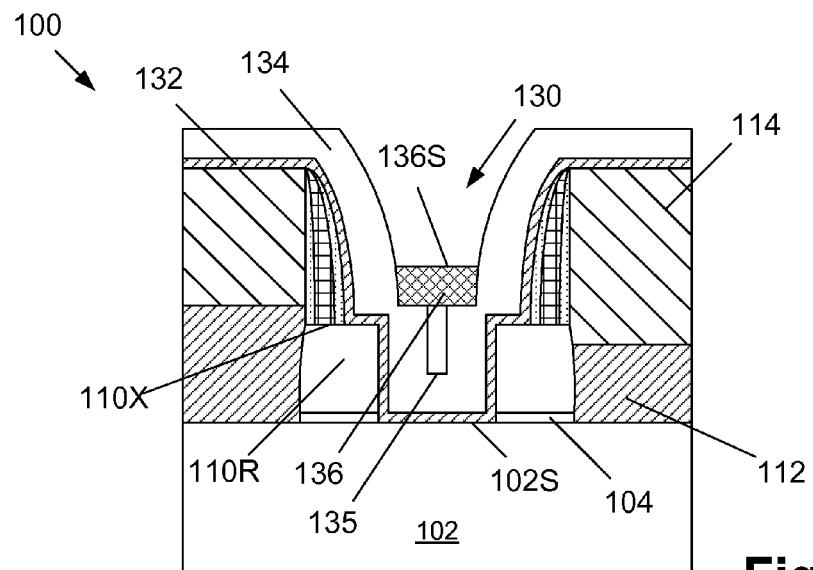

FIG. 2J depicts the device 100 after a sacrificial material 136 has been formed in the replacement gate cavity 130 and recessed (by performing an etch-back process) to expose the desired amount of the work function metal layer 134 that is to be removed. In one illustrative embodiment, the sacrificial material 136 may be an OPL material or DUO™ that is formed by performing a spin-coating process, thereafter dried and thereafter etched such that its upper surface 136S as at the desired height level in the replacement gate cavity 130. In some cases, the sacrificial material 136 may not fill all or part of the recess 135, as depicted in FIG. 2J. However, due to removal of portions of the spacers 110 which effectively widens the opening of the replacement gate cavity 130 above the recessed sacrificial gate structure 106R, the opening that must be filled by the sacrificial material 136 so that the work function metal recessing process may be performed is much wider than the width of the recess 135. Thus, even if the sacrificial material 136 does not fill all or part of the recess 135, the sacrificial material 136 may be reliably formed at the desired level and location within the replacement gate cavity 130. Of course, if the sacrificial material 136 completely fills the recess 135, that is acceptable as well.

Figure 2K:
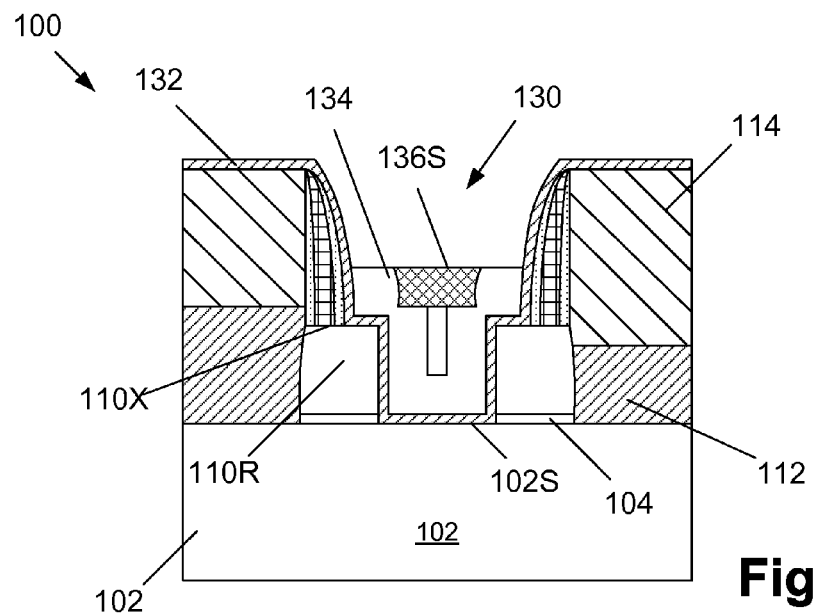

The next process operation involves recessing the exposed upper portions of at least the work function adjusting metal layer 134. To that end, FIG. 2K depicts the device 100 after one or more etching processes were performed to remove at least the work function adjusting metal layer 134 above the level of the surface 136S of the sacrificial material 136 from within the gate cavity 130. In the depicted process flow, the high-k gate insulation layer 132 is not removed during this process operation as it serves as an etch-stop layer during this process. Optionally, the exposed portion of the high-k gate insulation layer 132 may be removed during this process operation if desired.

Figure 2L:
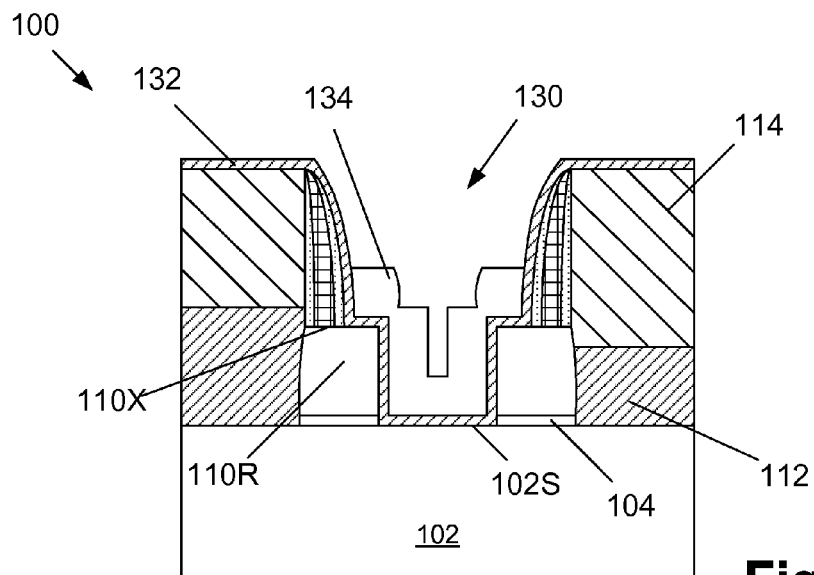

FIG. 2L depicts the device 100 after the sacrificial layer of material 136 has been removed from the replacement gate cavity 130. The sacrificial layer of material 136 may be removed by using a variety of known techniques depending upon the material selected for the sacrificial layer of material 136, e.g., a wet stripping process.

Figure 2M:
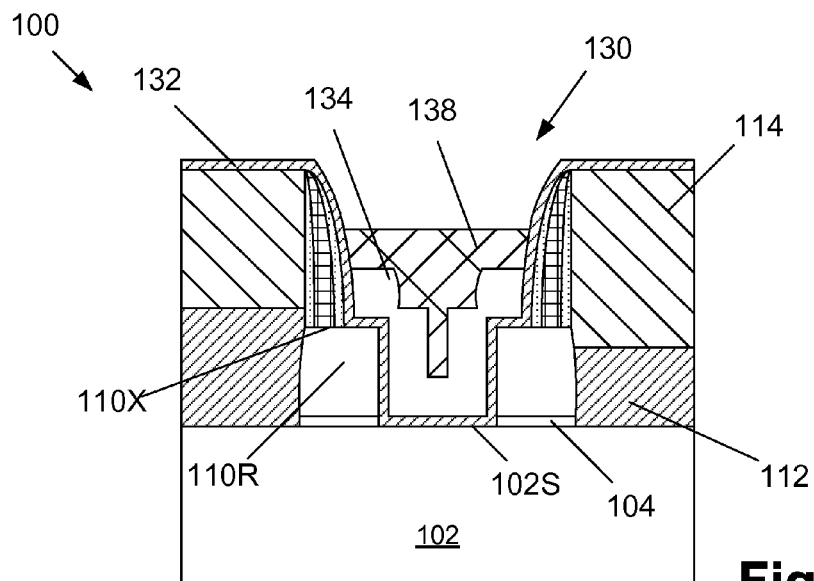

FIG. 2M depicts the device 100 after several process operations were performed. First, a bulk conductive material layer 138, such as tungsten or aluminum, was blanket-deposited above the substrate so as to over-fill the replacement gate cavity 130. Then, an etching process was performed on the conductive material layer 138 such that the desired amount of the conductive material layer 138 remains positioned within the replacement gate cavity 130.

Figure 2N:
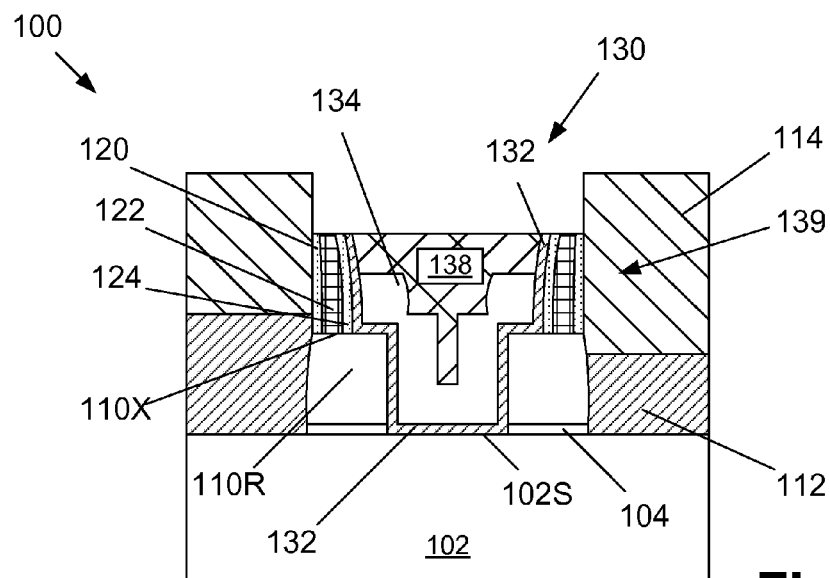

FIG. 2N depicts the device 100 after one or more wet or dry etching processes were performed to remove portions of the high-k gate insulation layer 132 and the spacers 120, 122 and 124. These operations result in the formation of the replacement gate structure 139 comprised of the high-k gate insulation layer 132, the work function adjusting metal layer 134 and the conductive material layer 138. In one illustrative embodiment, the high-k gate insulation layer 132 and the spacers 124, 122 and 120 may be removed by performing a series of sequential etching processes in the same process chamber or in different process tools. That is, the high-k gate insulation layer 132 may be removed using the third sidewall spacer 124 as an etch-stop, the third sidewall spacer 124 may be removed using the second sidewall spacer 122 as an etch-stop, the second sidewall spacer 122 may be removed using the first sidewall spacer 120 as an etch-stop and the first sidewall spacer 120 may be removed using the layer of insulating material 114 as an etch stop. These various etching processes may be timed etching processes.

Figure 2O:
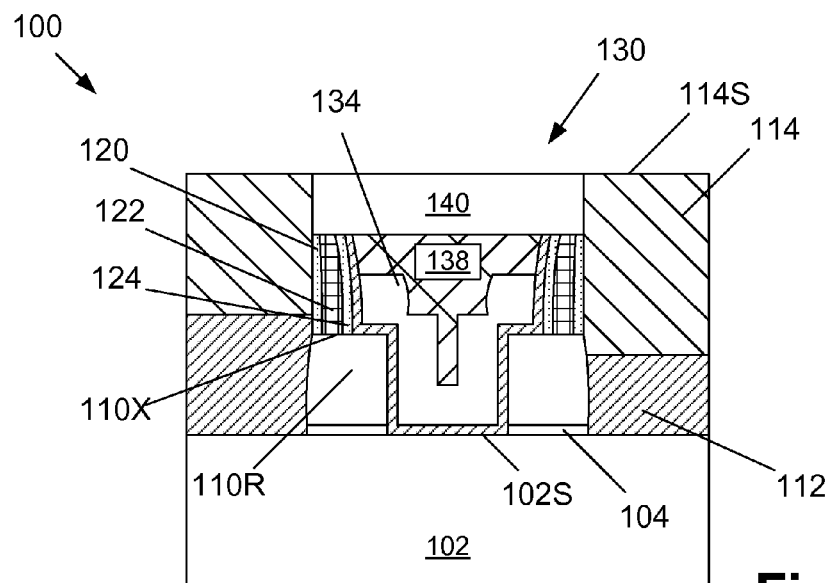

FIG. 2O depicts the device 100 after an illustrative gate cap layer 140 was formed in the recess above the recessed conductive material layer 138. The gate cap layer 140 may also be formed of a high-k material (k value of 5.5 or greater), e.g., typically silicon nitride. The gate cap layer 140 may be formed by depositing a layer of gate cap material so as to over-fill the recess formed in the replacement gate cavity 130 above the replacement gate structure 139 and, thereafter, performing a CMP process to remove excess portions of the gate cap material layer positioned above the surface 114S of the layer of insulating material 114. The gate cap layer 140 is typically formed so as to protect the underlying gate materials during subsequent processing operations. However, in accordance with one aspect of the inventions disclosed herein, the gate cap layer 140 also serves to protect the low-k spacer 122 during subsequent processing operations.

Figure 2P:
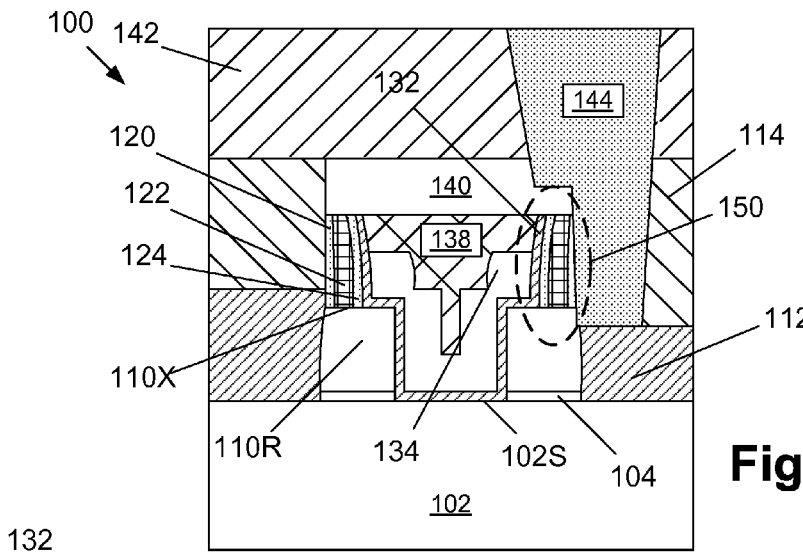

FIG. 2P depicts the device 100 after several process operations were performed to form an illustrative conductive source/drain contact structure 144 to one of the source/drain regions of the device 100. A gate contact structure (not shown) that is conductively coupled to the replacement gate structure 139, i.e., to the conductive gate materials that are part of the replacement gate electrode, may also be formed as part of these process operations. Typically, this processing sequence involves forming a layer of insulating material 142 above the device 100 and thereafter performing one or more etching processes through one or more etch mask layers (not shown) on the exposed portions of the layer of insulating material 142 and the underlying layer of insulating material 114 to define contact openings for the source/drain conductive structures 144. The source/drain contact structures 144 may be of any desired cross-sectional configuration when viewed from above, e.g., square, rectangular, round, etc. The source/drain contact structure 144 is intended to be schematic and representative in nature, as they may be formed using any of a variety of different conductive materials and by performing traditional manufacturing operations. The source/drain contact structure 144 may also contain one or more barrier layers (not depicted). In one illustrative example, the source/drain contact structures 144 may be formed by depositing a liner, e.g., Ti, TiN, followed by overfilling the contact openings with a conductive material, such as tungsten. Thereafter, a CMP process may be performed to planarize the upper surface of the layer of insulating material 142, which results in the removal of excess portions of the liner and the tungsten positioned above the layer of insulating material 142 outside of the contact openings and the formation of the source/drain contact structure 144.

The dashed ring 150 in FIG. 2P encloses a region of the device 100 that includes the low-k material, i.e., the spacer 122, which has been enlarged and schematically depicted in FIGS. 2Q-2T to discuss various aspects of the presently disclosed invention at the point in the process flow wherein the source/drain conductive structures 144 have been formed. In general, as will be appreciated by those skilled in the art, by forming the second sidewall spacer 122 using a low-k material, and positioning that low-k material between the replacement gate structure 139 and the source/drain contact structure 144, an undesirable increase in the Gate-to-Contact capacitance may be reduced as compared to prior art structures, even as device pitches continue to decrease.

Given the very small size of the spacers disclosed herein and inherent variations in processing techniques, e.g., alignment and etching variation, it is possible that some or all of one or both of the first sidewall spacer 120 (high-k material) and the third sidewall spacer 124 (high-k material) may be consumed during some aspect of performing process operations to manufacture the device 100 at the point in the process flow depicted in FIG. 2P. In some cases (not depicted) some of the low-k second sidewall spacer 122 may also be consumed. However, due to the protective nature of both the first and third sidewall spacers 120, 124 disclosed herein, as well as the gate cap layer 140, it is believed that the second sidewall spacer 122 will survive normal processing operations.

Figure 2Q:
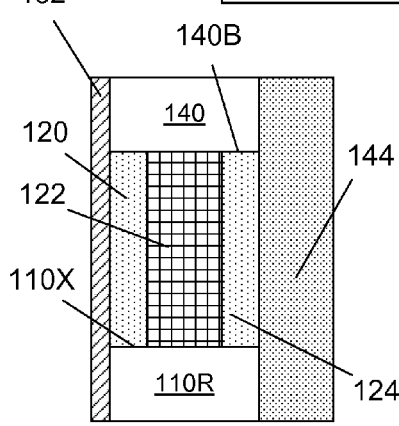

FIG. 2Q depicts the idealized situation wherein the both the first sidewall spacer 120 and the third sidewall spacer 124 remain substantially intact and, in combination with the gate cap layer 140 and the recessed spacers 110R serve to substantially encapsulate the remaining portions of the low-k second sidewall spacer 122. In this example, the first sidewall spacer 120 is positioned on and in contact with the high-k gate insulation layer 132, while the third sidewall spacer 124 is positioned on and in contact with the source/drain conductive structure 144.

Figure 2R:
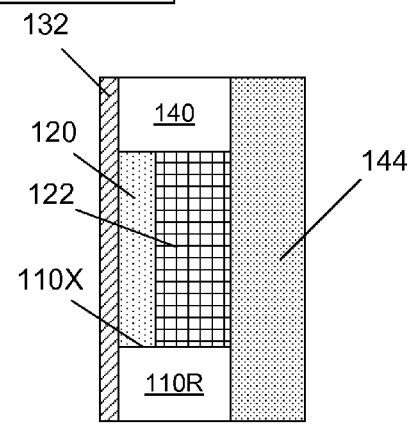

FIG. 2R depicts the situation wherein, due to various process operations, all (depicted) or a portion of the third sidewall spacer 124 was consumed during processing operations. In this situation, the first sidewall spacer 120 may remain substantially intact. In one example, despite best efforts, some or all of the third sidewall spacer 124 may be undesirably consumed during various etching process that are performed to form the contact opening for the source/drain conductive structure 144. In a real-world device, should all or a portion of the third sidewall spacer 124 be consumed and thereby expose all or a portion of the low-k second sidewall spacer 122, portions of the source/drain conductive structure 144 will be positioned laterally closer to (partial consumption of spacer 124) or contact (full consumption of spacer 124—depicted in FIG. 2R) the low-k second sidewall spacer 122.

Figure 2S:
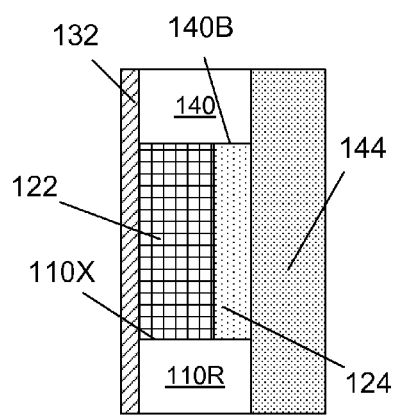

FIG. 2S depicts the situation wherein, due to various process operations, all (depicted) or a portion of the first sidewall spacer 120 was consumed during processing operations. In this situation, the third sidewall spacer 124 may remain substantially intact. In one example, despite best efforts, some or all of the first sidewall spacer 120 may be consumed during a high-k pre-clean process. In a real-world device, should all or a portion of the first sidewall spacer 120 be consumed and thereby expose all or a portion of the high-k (k value greater than 10) gate insulation layer 132, then the low-k second sidewall spacer 122 will be positioned laterally closer to (partial consumption of spacer 120) or contact (full consumption of spacer 120—depicted in FIG. 2S) the high-k (k value greater than 10) gate insulation layer 132.

Figure 2T:
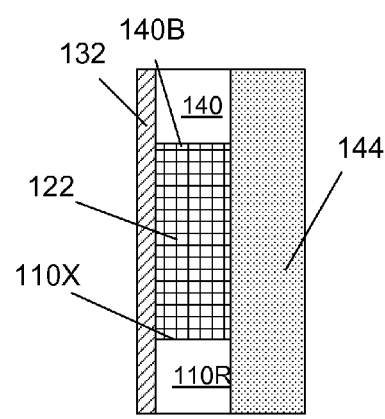

FIG. 2T depicts the situation wherein, due to various process operations, all (depicted) or a portion of the first sidewall spacer 120 and the third sidewall spacer 124 were consumed during processing operations. In this situation, the low-k second sidewall spacer 122 contacts the high-k (k value greater than 10) gate insulation layer 132 and the source/drain conductive structure 144. Of course, in a real-world device, there are an infinite variations in the amount of possible consumptions of the spacers 120, 122 and 124.

Note that, in all of the embodiments disclosed herein, the remaining portion of the low-k second sidewall spacer 122 contacts the bottom surface 140B of the gate cap layer 140 and the recessed upper surface 110X of the recessed spacers 110R. By virtue of the formation of the first sidewall spacer 120, the third sidewall spacer 124 and the gate cap layer 140 and the recessed spacers 110R as described herein, the low-k second sidewall spacer 122 may be formed so as to reduce the undesired Gate-to-Contact capacitance, as described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a replacement gate structure above a substrate, comprising:
    forming a sacrificial gate structure above a surface of said substrate, said sacrificial gate structure comprising a sacrificial gate electrode;
    forming a sidewall spacer adjacent opposite sides of said sacrificial gate electrode;
    forming a layer of insulating material adjacent said sidewall spacers;

performing at least one first etching process to remove a portion, but not all, of said sacrificial gate electrode so as to thereby define a recessed sacrificial gate electrode having a recessed upper surface;

performing at least one second etching process to recess said sidewall spacers so as to define recessed sidewall spacers positioned adjacent said recessed sacrificial gate electrode, wherein said recessed sidewall spacers have a recessed upper surface that is positioned above said surface of said substrate and wherein said recessed upper surface of said recessed sidewall spacers, said recessed upper surface of said recessed sacrificial gate electrode and said layer of insulating material define a gate opening;

forming a plurality of sidewall spacers above said recessed upper surface of said sidewall spacers within said gate opening, said plurality of sidewall spacers comprising one low-k spacer comprised of an insulating material having a dielectric constant equal to or less than 3.9 that is positioned laterally between two other spacers of said plurality of sidewall spacers;

after forming said plurality of sidewall spacers, removing at least said recessed sacrificial gate electrode so as to define, at least in part, a replacement gate cavity;

forming a replacement gate structure within said replacement gate cavity; and forming a gate cap layer within said replacement gate cavity above said replacement gate structure.

2. The method of claim 1, wherein forming said plurality of sidewall spacers comprises:

forming a first sidewall spacer on said layer of insulating material within said gate opening;

forming a second sidewall spacer comprised of said low-k insulating material on said first sidewall spacer; and forming a third sidewall spacer on said second sidewall spacer.

3. The method of claim 2, wherein said first and third sidewall spacers are comprised of a material that is selectively etchable relative to said second sidewall spacer.

4. The method of claim 2, wherein said first and third sidewall spacers are comprised of silicon nitride and said second sidewall spacer is comprised of silicon dioxide.

5. The method of claim 2, wherein said first sidewall spacer, said third sidewall spacer, said recessed sidewall spacer and said gate cap layer collectively encapsulate said second low-k sidewall spacer.

6. The method of claim 1, wherein said two other spacers are comprised of a material having a dielectric constant of 5.5 or greater.

7. The method of claim 1, wherein a lower surface of said low-k sidewall spacer contacts said recessed upper surface of said recessed sidewall spacers and an upper surface of said low-k sidewall spacer contacts a bottom surface of said gate cap layer.

8. The method of claim 1, wherein said two other spacers, said recessed sidewall spacer and said gate cap layer collectively encapsulate said low-k sidewall spacer.

* * * * *